US008513077B2

United States Patent
Kobayashi

(10) Patent No.: US 8,513,077 B2
(45) Date of Patent: Aug. 20, 2013

(54) SEMICONDUCTOR DEVICE AND METHOD OF MANUFACTURING THE SAME

(75) Inventor: Naoto Kobayashi, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 13/199,951

(22) Filed: Sep. 13, 2011

(65) Prior Publication Data

US 2012/0061748 A1  Mar. 15, 2012

(30) Foreign Application Priority Data

Sep. 14, 2010 (JP) .................................. 2010-205698
Jun. 30, 2011 (JP) .................................. 2011-145895

(51) Int. Cl.
*H01L 21/336* (2006.01)

(52) U.S. Cl.
USPC  438/270; 257/330; 257/E21.41; 257/E29.262

(58) Field of Classification Search
USPC ............ 257/330, E21.41, E29.262; 438/270
See application file for complete search history.

(56) References Cited

U.S. PATENT DOCUMENTS 6,251,730 B1 *  6/2001  Luo ............................... 438/270
2006/0273388 A1 * 12/2006  Yamazaki ..................... 257/330

FOREIGN PATENT DOCUMENTS

JP           11103052       4/1999
JP          2002359294     12/2002

* cited by examiner

*Primary Examiner* — N Drew Richards
*Assistant Examiner* — Jay C Chang
(74) *Attorney, Agent, or Firm* — Adams & Wilks

(57) ABSTRACT

A method of manufacturing a semiconductor device includes forming a silicon nitride film directly on a surface of a semiconductor substrate, forming a first silicon dioxide film on the silicon nitride film, and forming a trench from the surface of the substrate at an opening provided in the silicon nitride and first silicon dioxide films. The first silicon dioxide film is then removed, and a second silicon dioxide film as a gate oxide film is formed on a side surface of the trench. Thereafter, a gate electrode material is deposited directly on a surface of the silicon nitride film to fill the trench and the gate electrode material is removed from the surface of the silicon nitride film to form a gate electrode inside the trench. The method further includes removal of the nitride film and the formation of a source region at a periphery of the trench.

20 Claims, 3 Drawing Sheets

US 8,513,077 B2

SEMICONDUCTOR DEVICE AND METHOD OF MANUFACTURING THE SAME

BACKGROUND OF THE INVENTION

1. Field of the Invention

The present invention relates to a method of manufacturing a semiconductor device, and more particularly, to a method of manufacturing a vertical metal oxide silicon field-effect transistor (MOSFET) having a trench structure.

2. Description of the Related Art

Vertical MOSFETs may be classified into a so-called planar type and a so-called trench type. Since low on-resistance characteristic can be easily obtained by its structure of a trench type vertical MOSFET, in which a gate electrode is buried in a trench, practical use is in progress. The structure and manufacturing steps of the vertical MOSFET having such a trench structure are disclosed in, for example, Japanese Published Patent Application No. 2002-359294 and Japanese Published Patent Application No. 11-103052.

Two examples of the structure of the conventional vertical MOSFET are described. In the description below, the symbols −, +, and ++ written after N represent relative concentration levels of contained impurities, and the concentration increases in order of −, +, and ++. In the structure illustrated in FIG. 3A, an N+ buried layer 2 is formed on a P type silicon substrate 1, and a P type silicon layer 3 is further formed on the silicon substrate 1. In the P type silicon layer 3, an N− type drain layer 4 is formed so as to reach the N+ buried layer 2, and further, a P type well layer 5 is formed inside the N− type drain layer 4, the N− type drain layer 4 and the P type well layer 5 being formed by diffusion and the like. Further, at a surface outer perimeter portion of the vertical MOSFET other than a portion where an N++ type drain region 12 is later formed, an insulating film 6 is formed. A trench 7 is formed so as to have a depth from the surface of the P type well layer 5 to reach the N− type drain layer 4 beyond the P type well layer 5. A gate oxide film 8 is formed on the surface of the trench and a gate electrode 9 buries inside of the trench. Further, an N++ type source region 11 is provided at a portion adjacent to the P type well layer 5 and the trench 7. Further, the N++ type drain region 12 is provided at the surface of the N− type drain layer. Meanwhile, in the structure of the second example illustrated in FIG. 3B, the gate electrode 9 is protruded from the trench 7. Further, in order to avoid a channel to be formed at an upper end corner portion of the trench 7, an N type source region 10 is formed under the protruding portion of the gate electrode 9, which is a point different from FIG. 3A.

Here, the operation of the vertical MOSFET is briefly described. Under a state in which a forward bias is applied between the drain region 12 and the source region 11, when a predetermined voltage which is equal to or larger than a threshold value is applied to the gate electrode 9, an N type channel is formed in the P type well layer 5 along the trench 7, and thus a current flows between the source region and the drain region. A vertical channel is formed along the trench 7, and hence compared to the case of the planar type vertical MOSFET, a channel width per unit area can be significantly increased. Accordingly, there is an advantage that an on-resistance can be decreased.

Next, a method of manufacturing the vertical MOSFET is briefly described with reference to the case of FIG. 3A. First, the P type silicon substrate 1 is prepared, and at a portion to be formed as the region of the vertical MOSFET, the N+ buried layer 2 is formed by, for example, ion implantation. Then, the P type silicon layer 3 is formed on the silicon substrate 1 by, for example, epitaxial growth. Next, the N− type drain layer 4 is formed at the portion to be formed as the region of the MOSFET by ion implantation or thermal diffusion, and the P type well layer 5 is formed inside the N− type drain layer 4 by ion implantation or thermal diffusion. Next, at a portion to be formed as the region of the gate electrode, the trench 7, which has a depth reaching the N− type drain layer 4 from the surface of the P type well layer 5, is formed. Then, the gate oxide film 8 is formed inside the trench 7, a polysilicon film is provided to cover the entire surface, and then etch-back is performed, to thereby form the gate electrode 9 burying the trench 7. Then, for example, by photolithography, a portion adjacent to the P type well layer 5 and the trench 7 and a part of the surface of the N− type drain layer are opened, and then ion implantation of N type impurities is performed, to thereby form the N++ type source region 11 and the N++ type drain region 12. Then, the insulating film is deposited on the P type silicon layer 3, contact holes are formed in regions on the source region 11, the drain region 12, and the gate electrode 9, and metal electrodes are formed in the contact holes, to thereby form the main structure of the vertical MOSFET.

Meanwhile, in FIG. 3B, the N type source region 10 is formed before the polysilicon film is provided, and after the polysilicon film is provided to cover the entire surface, photoresist covering regions other than a part where the gate electrode 9 is to be formed is removed by photolithography to perform etching, to thereby form the gate electrode.

In the structure illustrated in FIG. 3A, by providing the polysilicon film to cover the entire surface and then performing etch-back, the gate electrode 9 buried in the trench 7 is formed. However, when the gate electrode 9 is subjected to etch-back to be deeper than the depth of the N++ type source region 11, the upper end of the gate electrode 9 will separate from the lower end of the source region 11, disabling the operation of the vertical MOSFET. Japanese Published Patent Application No. 11-103052 thus proposes a solution for this problem by forming an N++ type source region at the gate upper end portion of the side surface of the trench. However, in this method, fluctuations in etch-back directly cause change in channel length of the MOSFET, and hence there is a fear that manufacturing yield decreases.

Meanwhile, in the structure illustrated in FIG. 3B, there is an advantage that, unlike the former case, no influence is exerted by the fluctuations in the etching process. However, the number of manufacturing steps increases compared to that of the former case, and the element area increases, causing increase in unit price per chip, which leads to a cost problem.

SUMMARY OF THE INVENTION

It is an object of the present invention to provide a semiconductor device including a vertical MOSFET and a method of manufacturing the semiconductor device, which are capable of performing stable processing without increasing the number of manufacturing steps.

In order to solve the above-mentioned problems, a method of manufacturing a semiconductor device according to the present invention includes: forming a channel layer in a surface of a semiconductor substrate; forming a silicon nitride film and a first silicon dioxide film on the surface of the semiconductor substrate in the stated order, and providing an opening for forming a trench in the silicon nitride film and the first silicon dioxide film, which are covering the channel layer; forming the trench at a position of the opening from the surface of the semiconductor substrate with use of the silicon nitride film and the first silicon dioxide film as a mask, the trench being formed deeper than the channel layer; removing the first silicon dioxide film while leaving the silicon nitride film unremoved; forming a second silicon dioxide film as a gate oxide film at a side surface of the trench with use of the silicon nitride film as a mask; depositing a gate electrode material on a surface of the silicon nitride film so as to fill the trench, and removing the gate electrode material on the silicon nitride film with use of the silicon nitride film as a mask, to thereby form a gate electrode inside the trench so that an upper end surface of the gate electrode is positioned above a surface of the channel layer which is to be formed as a source region afterwards; and removing the silicon nitride film and then forming the source region at a periphery of the trench, the source region having a conductivity type opposite to a conductivity type of the channel layer.

Further, the forming of the source region may be carried out between the forming of the gate electrode and the removing of the silicon nitride film.

Further, the present invention provides a semiconductor device having a vertical MOSFET having a trench structure, the semiconductor device including: a channel layer of a second conductivity type provided in a semiconductor substrate of a first conductivity type; a trench provided so as to pass through the channel layer from a surface of the channel layer; a gate insulating film provided at an inner wall surface of the trench; a gate electrode filled inside the trench via the gate insulating film; and a source region disposed at a periphery of the trench, in which the gate electrode has an upper end surface positioned above the surface of the channel layer to be formed as the source region afterwards, and a side surface of the gate electrode in an upper end portion has the same shape as a side surface of the gate electrode inside the trench.

According to the present invention, while leaving the silicon nitride film used to form the trench on the surface of the semiconductor substrate, the gate electrode material buries the trench, and then the gate electrode material on the silicon nitride film is removed, to thereby form the gate electrode inside the trench. As a result the upper end portion of the gate electrode material is never formed below the surface of the semiconductor substrate when the gate electrode material is removed, if the over-etching amount does not exceed the thickness of the silicon nitride film. Accordingly, characteristic fluctuations of the semiconductor device caused by the etching process of the gate electrode material are reduced. Further, since the upper portion of the gate electrode is shaped into an I-shape having the same width as the trench width and not shaped into a T-shape having a width longer than the trench width according to the manufacturing steps of the present invention, not only reduction in element area is achieved but also photolithography for forming the T-shape becomes unnecessary.

DETAILED DESCRIPTION OF THE PREFERRED EMBODIMENT

Hereinafter, a semiconductor device and a method of manufacturing the same according to the present invention are described with reference to the drawings by means of an embodiment. FIGS. 1A to 2D are schematic cross-sectional views illustrating steps of manufacturing the semiconductor device according to the embodiment of the present invention.

Figure 1A:
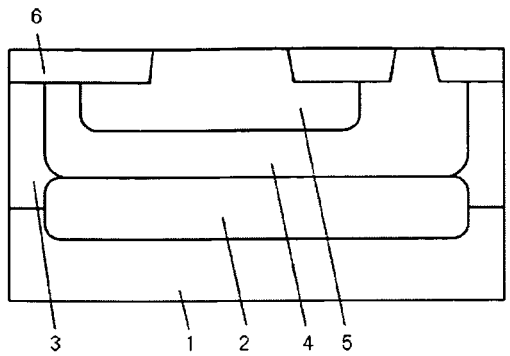
FIGS. 1A to 1D are schematic cross-sectional views illustrating steps of manufacturing a trench gate MOSFET according to an embodiment of the present invention.

FIG. 1A is a schematic cross-sectional view of the semiconductor device of the present invention, and illustrates a state after the manufacturing steps have been carried out to some extent. On a P type silicon substrate 1, an N+ buried layer 2 is formed, and further on the substrate 1, a P type silicon layer 3 is formed by epitaxial growth. Further, an N− type drain layer 4, which has a concentration lower than that of the N+ buried layer 2, is formed by thermal diffusion and the like, the N− type drain layer 4 being formed so as to reach the N+ buried layer 2 from the surface of the P type silicon layer 3. Further, a P type well layer (P type channel layer) 5 is formed inside the N− type drain layer 4. Further, at a surface outer perimeter portion, which becomes an outer side region of a trench and a source region of the vertical MOSFET, an insulating film 6 is formed on a portion other than a portion where an N++ type drain region is to be formed. In FIGS. 1A to 2D, the insulating film 6 is formed by a shallow trench isolation method, but the present invention is not limited thereto, and it is needless to say that the insulating film may be formed by a LOCOS method.

Figure 1B:
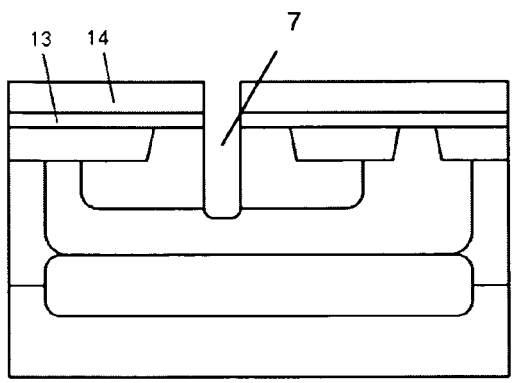

Subsequently, as illustrated in FIG. 1B, on the surface of the silicon substrate 1, a silicon nitride film 13 having a thickness of about 100 nm and a silicon dioxide film (first silicon dioxide film) 14 having a thickness of about 200 nm are deposited in this order, and then photolithography and etching are used to form a pattern constituted by the silicon nitride film and the silicon dioxide film, which have been opened only at a portion that is to be formed as a trench. With the use of this pattern as a mask, the silicon is subjected to etching until the silicon is removed from the surface of the substrate 1 beyond the P type channel layer 5, to thereby form a trench 7 having a width of about 1 μm.

Figure 1C:
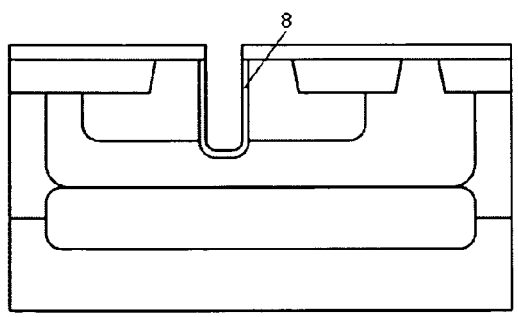

Subsequently, as illustrated in FIG. 1C, the pattern of the silicon dioxide film 14 is removed while leaving the silicon nitride film 13 unremoved, and then a silicon dioxide film 8 (second silicon dioxide film) as a gate oxide film is formed in the side surface of the trench by thermal oxidation, the silicon dioxide film 8 having a thickness of about 20 to 100 nm. At this time, the surface of the silicon substrate other than the portion where the trench is formed is covered with the silicon nitride film 13, and hence the oxide film is never formed. The silicon dioxide film 8 is formed only at the side surface of the trench.

Figure 1D:
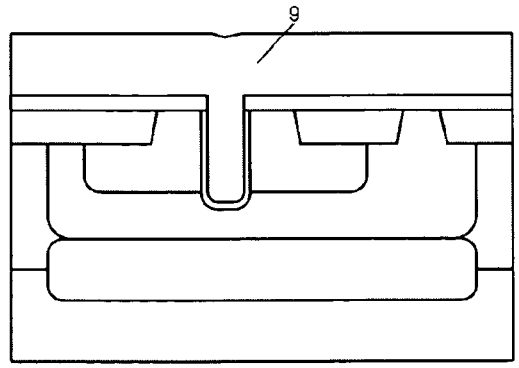

Subsequently, as illustrated in FIG. 1D, a polysilicon film 9 doped with impurities, which corresponds to a gate electrode material, is deposited until the trench 7 is completely filled. At the same time, the entire surface of the silicon substrate is covered with the polysilicon film 9.

Figure 2A:
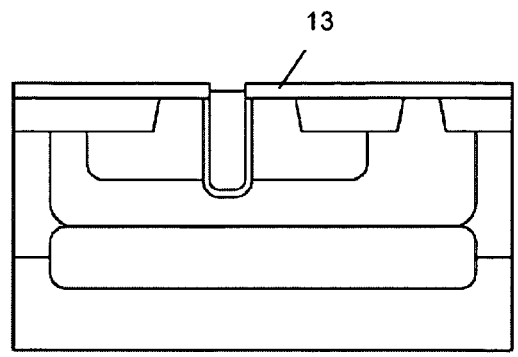
FIGS. 2A to 2D are schematic cross-sectional views following FIG. 1D, illustrating steps of manufacturing the trench gate MOSFET.
Figure 3A:
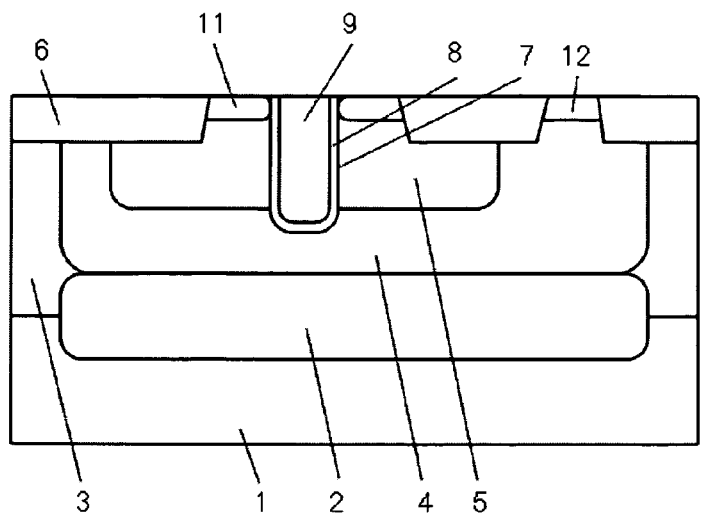
FIGS. 3A and 3B are views illustrating examples of cross-sectional structures of conventional trench gate MOSFETs.
Figure 3B:
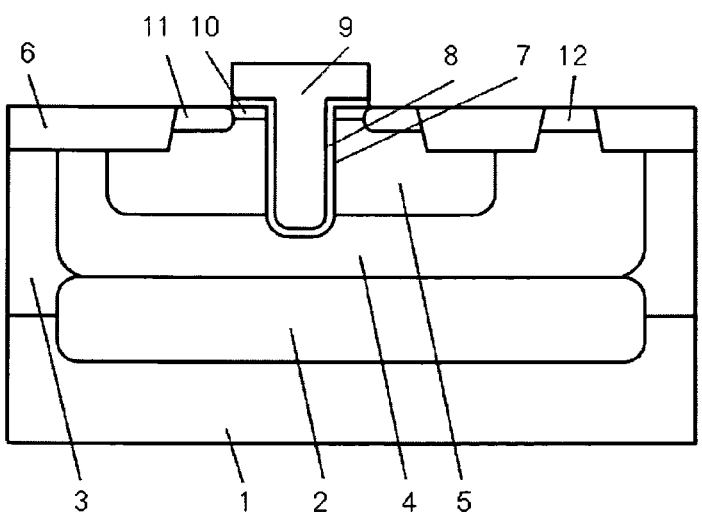

Then, in order to leave the polysilicon film only in the trench region to form the gate electrode as illustrated in FIG. 2A, by isotropic or anisotropic gas etching, the polysilicon film deposited on the surface of the silicon nitride film 13 is removed. At this time, the polysilicon film on the trench is also subjected to etching, but if the over-etching amount of the polysilicon film is smaller than the thickness of the silicon nitride film of 100 nm, the upper end surface of the polysilicon film can be formed above the surface of the P type channel layer 5 (surface of the original P type silicon layer 3). That is, the problems which have been described with reference to FIG. 3A that the channel length changes due to the etch-back and the manufacturing yield decreases are solved. Further, the opening portions of the silicon nitride film 13 and the trench 7 are substantially the same, and hence a photolithography step is unnecessary when forming the gate electrode. In addition, the upper portion of the gate electrode is not shaped into a T-shape having a width longer than the trench width, which has been described with reference to FIG. 3B, but shaped into an I-shape having a width of the trench width as it is even in the upper portion of the gate electrode. Accordingly, the element area can be reduced.

Figure 2B:
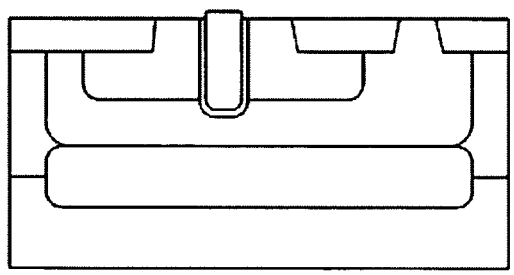
Figure 2C:
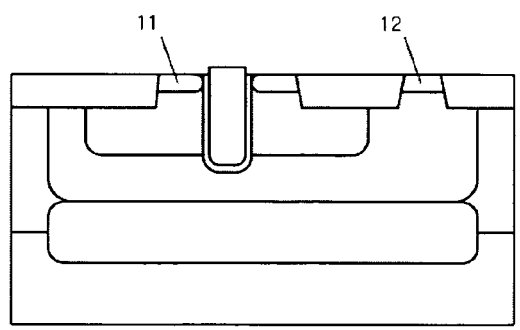

Subsequently, as illustrated in FIG. 2B, after the silicon nitride film is removed, as illustrated in FIG. 2C, by photolithography, an N++ type drain region 12 and an N++ type source region 11 are formed by ion implantation and the like. Here, the N++ type drain region 12 and the N++ type source region 11 may be formed before the silicon nitride film is removed.

Figure 2D:
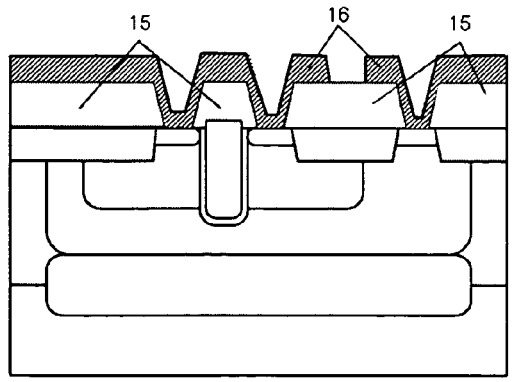

Finally, as illustrated in FIG. 2D, as an interlayer insulating layer, a phosphorus glass layer 15 having a thickness of about 1,000 nm is formed on the surface of the silicon substrate 1, and the phosphorus glass layer 15 is patterned into a predetermined shape so that contact holes are opened. Then, on the patterned phosphorus glass layer, a metal film made of, for example, aluminum is deposited and then patterned into a predetermined shape, to thereby form a metal electrode 16. Thus, the trench gate MOSFET according to the present invention is obtained.

Note that, in the present invention, an N-channel trench gate MOSFET has been exemplified, but the present invention is also applicable to a trench gate MOSFET having other structures or an insulated gate bipolar transistor (IGBT). The description above is merely an embodiment of the present invention, and it is needless to say that other various modified embodiments can be made without departing from the spirit of the present invention.

What is claimed is:

1. A method of manufacturing a semiconductor device, comprising:
    forming a channel layer in a surface of a semiconductor substrate;
    forming a silicon nitride film directly on the surface of the semiconductor substrate, forming a first silicon dioxide film on the silicon nitride film, and providing an opening for forming a trench in the silicon nitride film and the first silicon dioxide film, both of the silicon nitride film and the first silicon dioxide film covering the channel layer;
    forming the trench at a position of the opening from the surface of the semiconductor substrate using the silicon nitride film and the first silicon dioxide film as a mask, the trench being formed deeper than the channel layer;
    removing the first silicon dioxide film while leaving the silicon nitride film;
    forming a second silicon dioxide film as a gate oxide film on a side surface of the trench using the silicon nitride film as a mask;
    thereafter depositing a gate electrode material directly on a surface of the silicon nitride film so as to fill the trench and removing the gate electrode material on the silicon nitride film using the silicon nitride film as a mask, to thereby form a gate electrode inside the trench so that an upper end surface of the gate electrode is positioned above a surface of the channel layer to be formed as a source region; and
    removing the silicon nitride film and then forming the source region at a periphery of the trench, the source region having a conductivity type opposite to a conductivity type of the channel layer.

2. A method according to claim 1; wherein when the first silicon dioxide film is removed, the surface of the silicon substrate other than the portion thereof where the trench is formed is covered directly with the silicon nitride film.

3. A method according to claim 1; wherein the gate electrode material is deposited directly on the entire surface of the silicon nitride film.

4. A method of manufacturing a semiconductor device, comprising:
    forming a channel layer in a surface of a semiconductor substrate;
    forming a silicon nitride film directly on the surface of the semiconductor substrate, forming a first silicon dioxide film on the silicon nitride film, and providing an opening for forming a trench in the silicon nitride film and the first silicon dioxide film, both of the silicon nitride film and the first silicon dioxide film covering the channel layer;
    forming the trench at a position of the opening from the surface of the semiconductor substrate using the silicon nitride film and the first silicon dioxide film as a mask, the trench being formed deeper than the channel layer;
    removing the first silicon dioxide film while leaving the silicon nitride film;
    forming a second silicon dioxide film as a gate oxide film on a side surface of the trench using the silicon nitride film as a mask;
    thereafter depositing a gate electrode material directly on a surface of the silicon nitride film so as to fill the trench, and removing the gate electrode material on the silicon nitride film using the silicon nitride film as a mask, to thereby form a gate electrode inside the trench so that an upper end surface of the gate electrode is positioned above a surface of the channel layer to be formed as a source region; and
    forming the source region at a periphery of the trench, the source region having a conductivity type opposite to a conductivity type of the channel layer, and thereafter removing the silicon nitride film while maintaining a state in which the upper end surface of the gate electrode is positioned above the surface of the channel layer.

5. A method according to claim 4; wherein when the first silicon dioxide film is removed, the surface of the silicon substrate other than the portion thereof where the trench is formed is covered directly with the silicon nitride film.

6. A method according to claim 4; wherein the gate electrode material is deposited directly on the entire surface of the silicon nitride film.

7. A method of manufacturing a semiconductor device, comprising:
    forming a silicon nitride film directly on a surface of a semiconductor substrate;
    forming a first silicon dioxide film on the silicon nitride film;
    using the silicon nitride film and the first silicon dioxide film as a mask to form a trench from the surface of the semiconductor substrate at a position of an opening provided in the silicon nitride film and the first silicon dioxide film;
    removing the first silicon dioxide film while leaving the silicon nitride film;
    forming a second silicon dioxide film as a gate oxide film on a side surface of the trench using the silicon nitride film as a mask;
    thereafter depositing a gate electrode material directly on a surface of the silicon nitride film so as to fill the trench;
    removing the gate electrode material from the surface of the silicon nitride film using the silicon nitride film as a mask to thereby form a gate electrode inside the trench;

removing the silicon nitride film; and forming a source region at a periphery of the trench.

8. A method according to claim 7; wherein when the first silicon dioxide film is removed, the surface of the silicon substrate other than the portion thereof where the trench is formed is covered directly with the silicon nitride film.

9. A method according to claim 7; wherein the gate electrode material is deposited directly on the entire surface of the silicon nitride film.

10. A method according to claim 7; further comprising forming a channel layer in a surface of the semiconductor substrate prior to forming the silicon nitride film and the first silicon dioxide film.

11. A method according to claim 10; wherein the silicon nitride film and the silicon dioxide film are formed so as to cover the channel layer.

12. A method according to claim 10; wherein the trench is formed deeper than the channel layer.

13. A method according to claim 10; wherein the gate electrode is formed inside the trench so that an upper end surface of the gate electrode is positioned above a surface of the channel layer.

14. A method according to claim 10; wherein the source region is formed of a surface of the channel region.

15. A method according to claim 14; wherein the source region having a conductivity type opposite to a conductivity type of the channel layer.

16. A method according to claim 10; wherein the source region having a conductivity type opposite to a conductivity type of the channel layer.

17. A method according to claim 7; wherein the silicon nitride film is removed before the source region is formed.

18. A method according to claim 7; wherein the source region is formed before the silicon nitride film is removed.

19. A method according to claim 18; further comprising forming a channel layer in a surface of the semiconductor substrate prior to forming the silicon nitride film and the first silicon dioxide film.

20. A method according to claim 19; wherein the silicon nitride film is removed while maintaining a state in which the upper end surface of the gate electrode is positioned above the surface of the channel layer.

\* \* \* \* \*